(12) United States Patent
Jung

(10) Patent No.: US 7,981,803 B2
(45) Date of Patent: Jul. 19, 2011

(54) METHOD OF FORMING MICRO PATTERN OF SEMICONDUCTOR DEVICE

(75) Inventor: Woo Yung Jung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 829 days.

(21) Appl. No.: 11/965,979

(22) Filed: Dec. 28, 2007

(65) Prior Publication Data

US 2008/0280444 A1      Nov. 13, 2008

(30) Foreign Application Priority Data

May 11, 2007     (KR) .................. 10-2007-0045999

(51) Int. Cl.
*H01L 21/306* (2006.01)
(52) U.S. Cl. ............. 438/694; 438/197; 257/E21.215
(58) Field of Classification Search .............. 438/694, 438/197; 430/313; 257/304
See application file for complete search history.

(56) References Cited

U.S. PATENT DOCUMENTS

| | | | |
|---|---|---|---|
| 2005/0173750 A1* | 8/2005 | Park | 257/304 |
| 2006/0246731 A1 | 11/2006 | Nishida | |
| 2007/0155076 A1* | 7/2007 | Kim | 438/197 |

FOREIGN PATENT DOCUMENTS

| | | | |
|---|---|---|---|
| CN | 1606797 | | 4/2005 |
| CN | 1961410 | | 5/2007 |
| JP | 2006-135334 | | 5/2006 |
| KR | 1020000052195 | * | 8/2000 |
| KR | 1020000052195 A | | 8/2000 |
| KR | 1020060110096 | * | 10/2006 |
| KR | 1020060110096 A | | 10/2006 |
| KR | 1020070054297 A | | 5/2007 |
| KR | 1020070071043 A | | 7/2007 |
| KR | 10-2008-0029719 A | | 4/2008 |

OTHER PUBLICATIONS

Woo-Yung Jung, et al., *Patterning with Amorphous Carbon Spacer for Expanding the Resolution Limit of Current Lithography Tool*, Optical Microlithography XX, 2007, pp. 1-9, vol. 6520, 65201C, Proc. Of SPIE, Hynix Semiconductor Inc., Icheon-si, Republic of Korea and Lam Research Corporation, Fremont, California.

Woo-Yung Jung, et al., *Double Patterning of Contact Array with Carbon Polymer*, Optical Microlithography XXI, 2008, pp. 1-10, vol. 6924, 69240C, Proc. Of SPIE, Hynix Semiconductor Inc., Icheon-si, Republic of Korea and Lam Research Corporation, Fremont, California.

* cited by examiner

*Primary Examiner* — Duy-Vu N Deo
*Assistant Examiner* — Mahmoud Dahimene
(74) *Attorney, Agent, or Firm* — Kilpatrick Townsend & Stockton LLP

(57) ABSTRACT

The present invention relates to a method of forming a micro pattern of a semiconductor device. In the method according to an aspect of the present invention, an etch target layer, a first hard mask layer, and insulating patterns of a lonzenge are formed over a semiconductor substrate. A first auxiliary pattern is formed on the first hard mask layer including the insulating patterns, wherein a contact hole having the same shape as that of the insulating pattern is formed at the center of four adjacent insulating patterns, which form a quadrilateral. A second auxiliary pattern is formed by etching the first auxiliary pattern so that a top surface of the insulating patterns is exposed. The exposed insulating patterns are removed. A first hard mask pattern is formed by etching the first hard mask layer using an etch process employing the second auxiliary pattern as an etch mask. The etch target layer is etched using the first hard mask pattern.

37 Claims, 12 Drawing Sheets

METHOD OF FORMING MICRO PATTERN OF SEMICONDUCTOR DEVICE

CROSS-REFERENCES TO RELATED APPLICATIONS

The present application claims priority to Korean patent application number 10-2007-045999, filed on May 11, 2007, which is incorporated by reference in its entirety.

BACKGROUND OF THE INVENTION

The present invention relates to a method of forming a micro pattern of a semiconductor device and, more particularly, to a method of forming a micro pattern as it applies to the formation of DRAM bit line contact holes.

As the integration level of semiconductor devices is increased, a minimum line width gradually shrinks. Several process methods are employed in order to implement a desired micro line width due to the higher integration of devices.

However, a micro pattern formed using a spacer is applicable to only a line and space pattern. In particular, the micro pattern can be applied to a case where the patterns of a cell gate region have a very simple pattern, such as NAND flash memory devices, or a 2-dimensional array having an excellent regularity. If a Double Exposure & Etch Technique (DEET) method is used, a bit line contact hole pattern of a DRAM can be formed, but a Critical Dimension (CD) becomes irregular due to overlay problem. Further, since a mask formation process has to be performed twice, the production cost is increased.

BRIEF SUMMARY OF THE INVENTION

The present invention is directed to form a micro pattern having a target CD by forming a first auxiliary pattern having a first contact hole, which has the same shape as that of an insulating pattern, at the center of four adjacent insulating patterns, which form a quadrilateral, and is also applicable to a DRAM bit line contact hole formation process.

According to a method of forming a micro pattern of a semiconductor device in accordance with a first embodiment of the present invention, an etch target layer, a first hard mask layer, and insulating patterns of a lonzenge are formed over a semiconductor substrate. A first auxiliary pattern is formed on the first hard mask layer including the insulating patterns, wherein a contact hole having the same shape as that of the insulating pattern is formed at the center of four adjacent insulating patterns, which form a quadrilateral. A second auxiliary pattern is formed by etching the first auxiliary pattern so that a top surface of the insulating patterns is exposed. The exposed insulating patterns are removed. A first hard mask pattern is formed by etching the first hard mask layer using an etch process employing the second auxiliary pattern as an etch mask. The etch target layer is etched using the first hard mask pattern.

The etch target layer may have a stack structure of a conductive layer and an insulating layer. The first hard mask layer may have a stack structure of an amorphous carbon layer and a SiON layer. The insulating patterns may be made of oxide.

The first auxiliary pattern may be formed from a carbon layer or a polysilicon layer. The first auxiliary pattern may have an etch selectivity different from that of the insulating patterns. The first auxiliary pattern may be formed to a thickness so that the first auxiliary pattern formed on a sidewall of an end of the insulating pattern touches with the first auxiliary pattern formed on a sidewall of an end of an adjacent insulating pattern. The first auxiliary pattern formed in the peripheral region of the contact hole may have a step with the first auxiliary pattern formed on the insulating patterns. The first auxiliary pattern formed in the peripheral region of the contact hole may be lower in height than the first auxiliary pattern formed on the insulating patterns. A second hard mask layer may be further formed on the first auxiliary pattern so that between-the contact holes are gap filled after the first auxiliary pattern is formed. The second hard mask layer may be made of a conductive material or an insulating material. The second hard mask layer may be made of an Organic Bottom Anti-Reflective Coating (OBARC) material containing silicon (Si), or a Spin on Glass (SOG) material. A bake process may be further performed after a deposition process when the SOG material is used. The second hard mask layer may have an etch selectivity different from that of the first auxiliary pattern. The second hard mask layer may be further removed until a top surface of the first auxiliary pattern is exposed after the second hard mask layer is formed.

The first auxiliary pattern may be etched using an etchback process. At the time of the etch process of the first auxiliary pattern formed on the insulating patterns, a top surface of the first auxiliary pattern formed in the peripheral region of the contact hole may be also partially removed. At the time of the removal process of the insulating patterns, the remaining second hard mask layer may be also removed. The second auxiliary pattern formed in the peripheral region of the contact hole may have a step with the second auxiliary pattern formed in the peripheral region of the insulating patterns. The second auxiliary pattern formed in the peripheral region of the contact hole may be lower in height than the second auxiliary pattern formed in the peripheral region of the insulating patterns.

According to a method of forming a micro pattern of a semiconductor device in accordance with a second embodiment of the present invention, an etch target layer, a first hard mask layer, and insulating patterns of a lonzenge are formed over a semiconductor substrate. A first auxiliary pattern is formed on the first hard mask layer including the insulating patterns, wherein a contact hole having the same shape as that of the insulating pattern is formed at the center of four adjacent insulating patterns, which form a quadrilateral. A second hard mask layer is formed between the first auxiliary patterns. A second auxiliary pattern is formed by etching the first auxiliary pattern so that a top surface of the insulating patterns is exposed. The exposed insulating patterns and the second hard mask are removed. A first hard mask pattern is formed by etching the first hard mask layer using an etch process employing the second auxiliary pattern as an etch mask. The etch target layer is etched using the first hard mask pattern.

The etch target layer may have a stack structure of a conductive layer and an insulating layer. The first hard mask layer may have a stack structure of an amorphous carbon layer and a SiON layer. The insulating patterns may be made of oxide.

The e first auxiliary pattern may be formed from a carbon layer or a polysilicon layer. The first auxiliary pattern may have an etch selectivity different from that of the insulating patterns. The first auxiliary pattern may be formed to a thickness so that the first auxiliary pattern formed on a sidewall of an end of the insulating pattern touches with the first auxiliary pattern formed on a sidewall of an end of an adjacent insulating pattern. The first auxiliary pattern formed in the peripheral region of the contact hole may have a step with the first auxiliary pattern formed on the insulating patterns. The first auxiliary pattern formed in the peripheral region of the contact hole may be lower in height than the first auxiliary pattern formed on the insulating patterns.

The second hard mask layer may be made of a conductive material or an insulating material. The second hard mask layer may be made of an OBARC material containing silicon (Si), or a SOG material. A bake process may be further performed after a deposition process when the SOG material is used. The second hard mask layer may have an etch selectivity different from that of the first auxiliary pattern.

The first auxiliary pattern may be etched using an etchback process. At the time of the etch process of the first auxiliary pattern formed on the insulating patterns, a top surface of the first auxiliary pattern formed in the peripheral region of the contact hole may be also partially removed. The second auxiliary pattern formed in the peripheral region of the contact hole may have a step with the second auxiliary pattern formed in the peripheral region of the insulating patterns. The second auxiliary pattern formed in the peripheral region of the contact hole may be lower in height than the second auxiliary pattern formed in the peripheral region of the insulating patterns.

DESCRIPTION OF SPECIFIC EMBODIMENTS

Specific embodiments according to the present invention will be described with reference to the accompanying drawings.

FIGS. 1A to 1H are plan views illustrating a method of forming a micro pattern of a semiconductor device according to an embodiment of the present invention. FIGS. 2A to 2H are sectional views of the device taken along line A-A of FIGS. 1A to 1H. FIGS. 3A to 3H are sectional views of the device taken along line B-B of FIGS. 1A to 1H. Process steps only in a cell region are described below for simplicity.

Figure 1A:
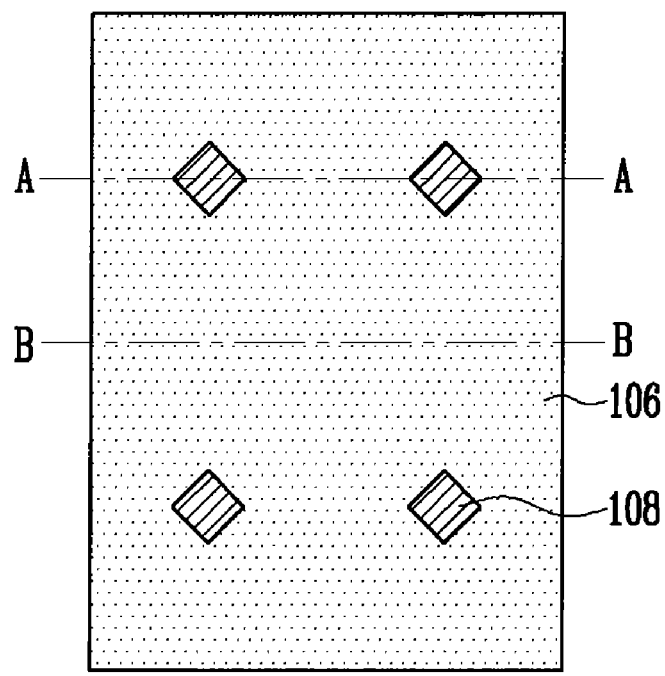
FIGS. 1A to 1H are plan views illustrating a method of forming a micro pattern of a semiconductor device according to an embodiment of the present invention.
Figure 2A:
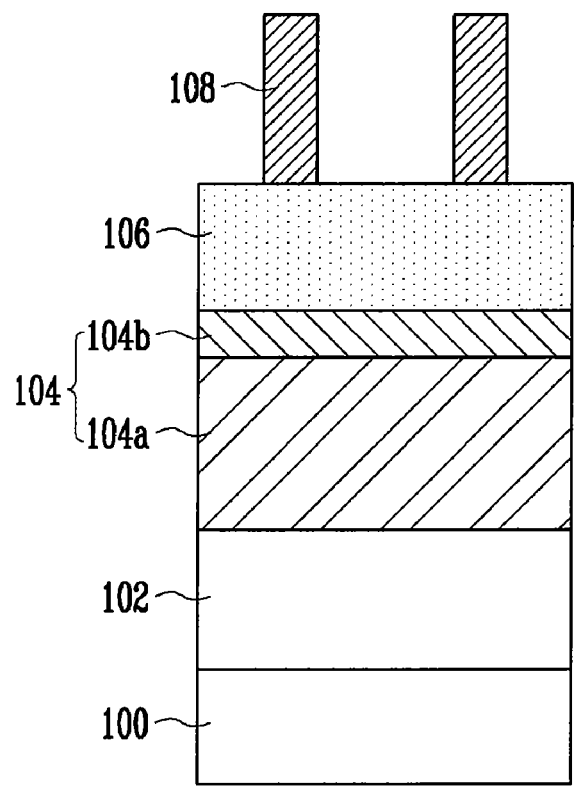
FIGS. 2A to 2H are sectional views of the device taken along line A-A of FIGS. 1A to 1H.
Figure 3A:
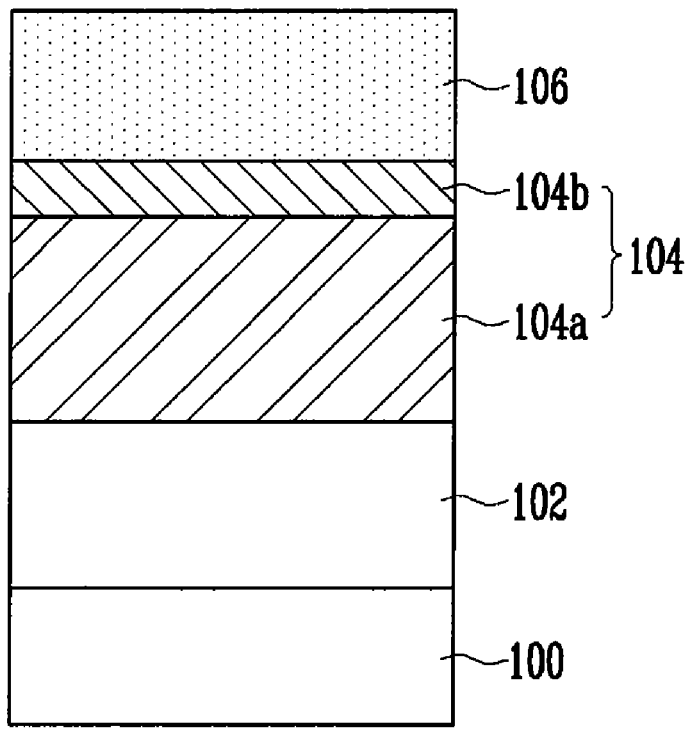
FIGS. 3A to 3H are sectional views of the device taken along line B-B of FIGS. 1A to 1H.

Referring to FIGS. 1A, 2A and 3A, an etch target layer 102, a first hard mask layer 104, and an insulating layer 106 are sequentially formed over a semiconductor substrate 100. The etch target layer 102 may have a stack structure including a conductive layer and an insulating layer in order to form bit line contact holes. The first hard mask layer 104 may have a stack structure including an amorphous carbon layer 104a and a silicon oxynitride (SiON) layer 104b. The insulating layer 106 may be formed from oxide. Oxide is used for the insulating layer 106 because oxide is transparent, which makes wafer alignment possible in a subsequent photoresist pattern formation process and therefore an additional process for aligning the wafer does not need to be performed.

Photoresist patterns 108 are formed on the insulating layer 106. In the prior art, the photoresist patterns 108 are formed in a subsequent process so that regions in which bit line contact holes will be formed are opened. In the present invention, however, the photoresist patterns 108 are formed only in regions in which bit line contact holes will be formed using a subsequent process. Further, each of the photoresist patterns 108 has a lozenge shape (or diamond shape) unlike the existing quadrilateral shape.

Figure 1B:
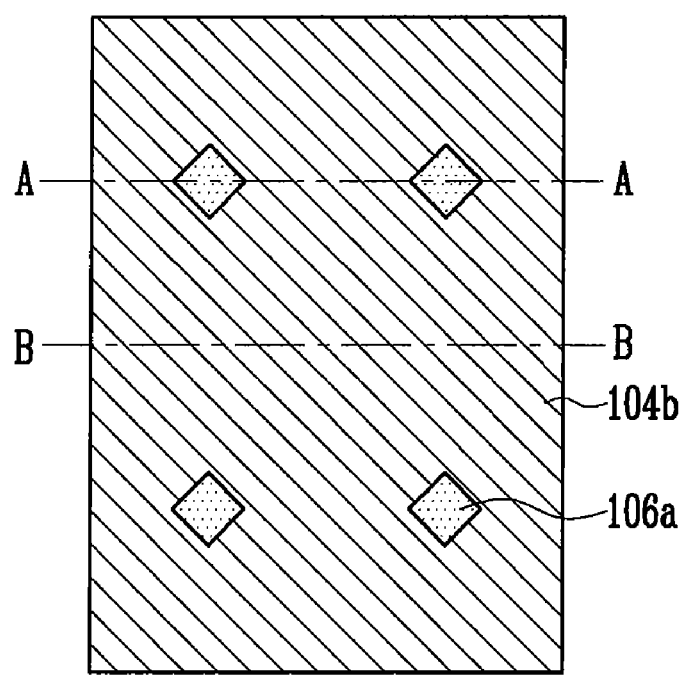
Figure 2B:
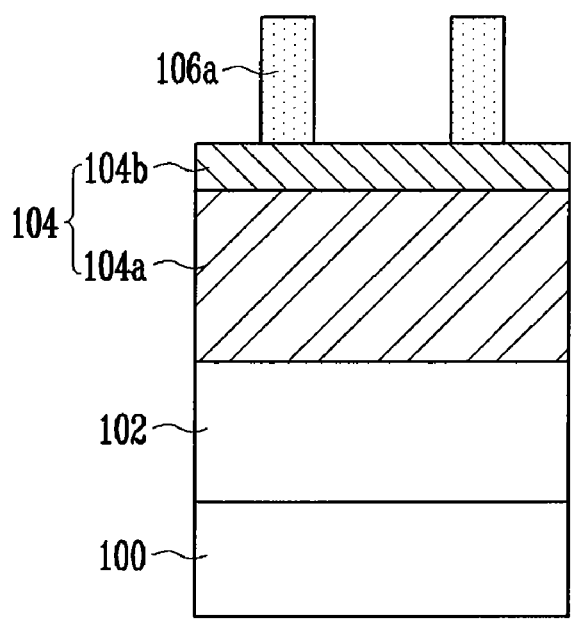
Figure 3B:
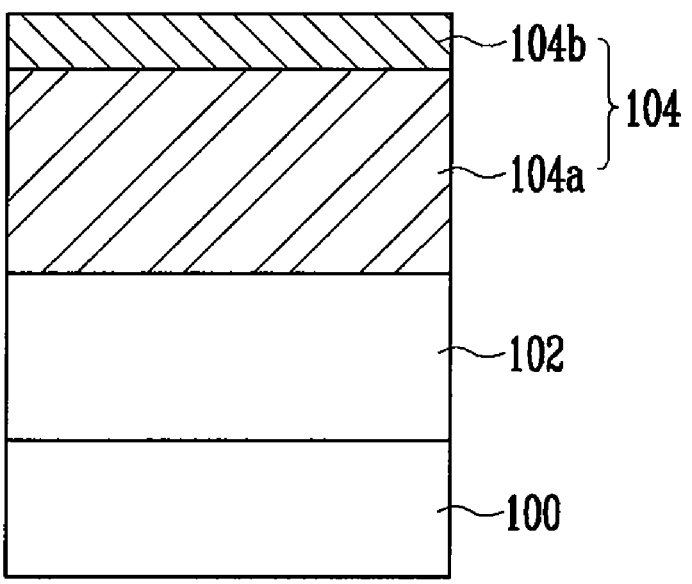

Referring to FIGS. 1B, 2B and 3B, insulating patterns 106a are formed by etching the insulating layer 106 using the photoresist patterns 108 as an etch mask. The photoresist patterns 108 are then removed. Each of the insulating patterns 106a has a lozenge shape, which is the same as that of the photoresist patterns 108.

Figure 1C:
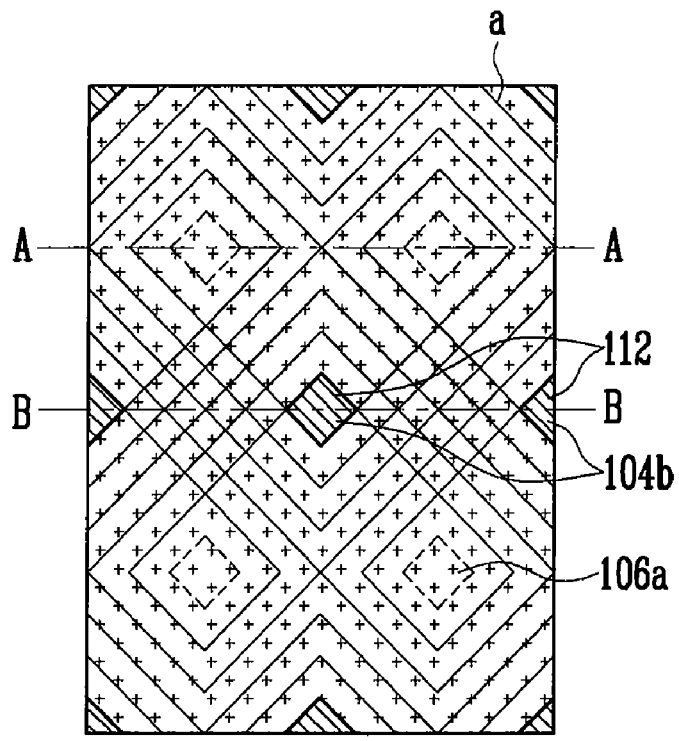
Figure 2C:
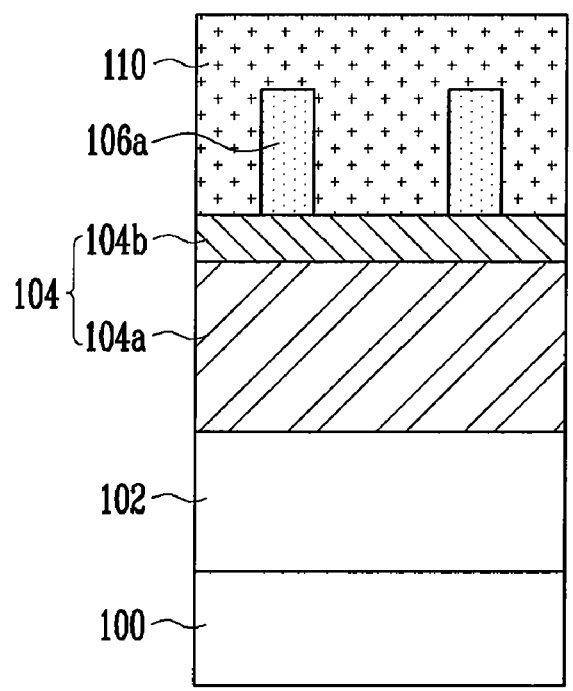
Figure 3C:
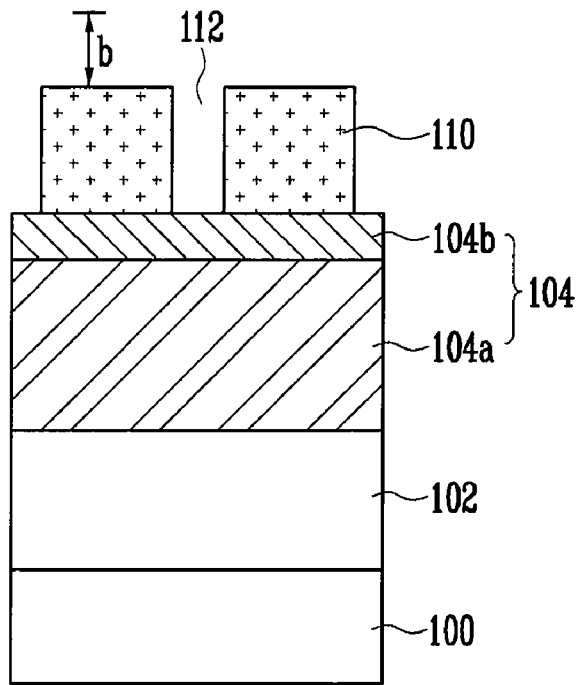

Referring to FIGS. 1C, 2C and 3C, a first auxiliary pattern 110 is formed on a top surface of the first hard mask layer 104 and the insulating patterns 106a. The first auxiliary pattern 110 may be formed from a carbon layer or a polysilicon layer. The reason why the first auxiliary pattern 110 uses a carbon layer or a polysilicon layer is that these layers have an etch selectivity different from that of the insulating patterns 106a. This means the insulating patterns 106a can be removed while preventing the first auxiliary pattern 110 from being damaged in a subsequent etch process. For this reason, the first auxiliary pattern 110 may be made of a material having an etch selectivity different from that of the insulating patterns 106a.

If the first auxiliary pattern 110 formed on the sidewall of the end of the insulating patterns 106a having a lozenge shape is formed to a thickness to the extent that it touches with the first auxiliary pattern 110 formed on the sidewall of the end of an adjacent insulating pattern 106a (indicated by "a"), the first auxiliary pattern 110 having first contact holes 112, which have the same shape as that of the insulating patterns 106a, is formed at the center of the four adjacent insulating patterns 106a, which form a quadrilateral, as shown in FIG. 5C. The first contact holes 112 are regions in which bit line contact holes are formed in a subsequent process. In the formation process of the first contact holes 112, the first auxiliary pattern 110 formed in the peripheral region of the first contact holes 112 is lower in height than the first auxiliary pattern 110 formed on the insulating patterns 106a by a step b.

Figure 1D:
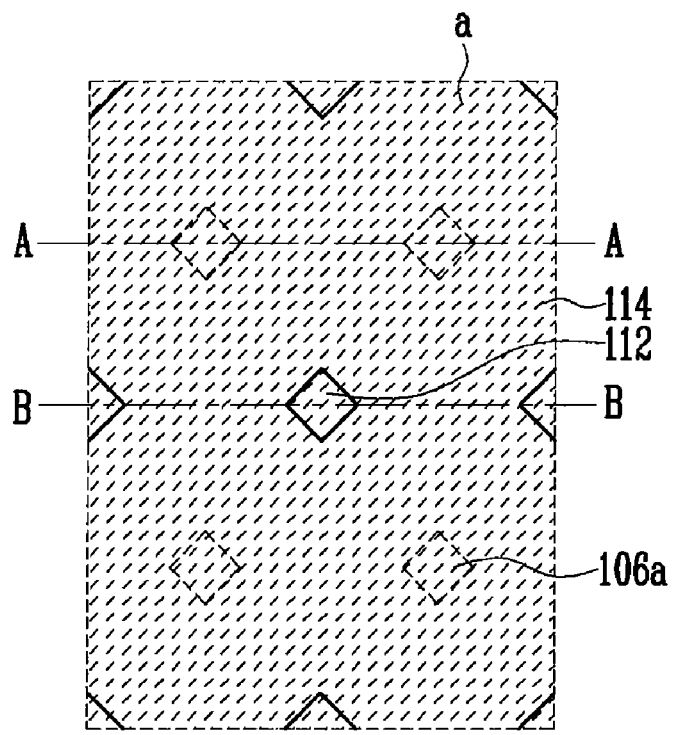
Figure 2D:
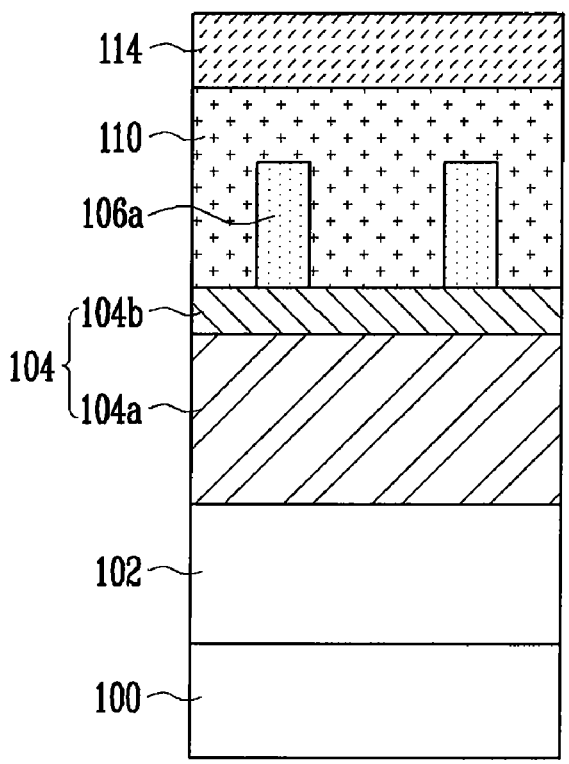
Figure 3D:
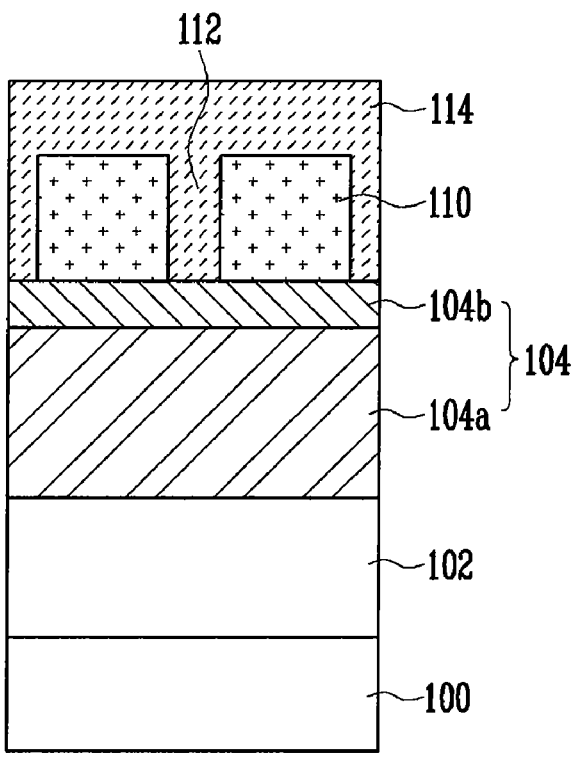

Referring to FIGS. 1D, 2D and 3D, a second hard mask layer 114 is formed on the first auxiliary pattern 110 formed in the peripheral region of the first contact holes 112, the first auxiliary pattern 110 formed on the insulating patterns 106a, and the silicon oxynitride (SiON) layer 104b so that the first contact holes 112 is gap filled. The second hard mask layer 114 may be made of a conductive material or an insulating material, such as Organic Bottom Anti-Reflective Coating (OBARC) containing silicon (Si) or Spin on Glass (SOG) having a good gap-fill characteristic. The SOG material contains impurities and moisture and therefore must go through a bake process after a deposition process in order to remove them. The second hard mask layer 114 may have an etch selectivity different from that of the first auxiliary pattern 110.

The second hard mask layer 114 is formed so that it can prevent damage to the silicon oxynitride (SiON) layer 104b exposed due to the first contact holes 112 in a subsequent etch process of the first auxiliary pattern 110. However, in order to reduce the process steps, the second hard mask layer 114 may be omitted. In the case where the formation process of the second hard mask layer 114 is omitted, the silicon oxynitride (SiON) layer 104b exposed due to the first contact holes 112 at the time of the etch process of the first auxiliary pattern 110 can be partially damaged, but a subsequent process will not be affected. Further, in a subsequent process of removing the insulating patterns 106a, the silicon oxynitride (SiON) layer 104b may have an etch selectivity different from that of oxide of the insulating patterns 106a in order to prevent the exposed silicon oxynitride (SiON) layer 104b from being excessively damaged.

Figure 1E:
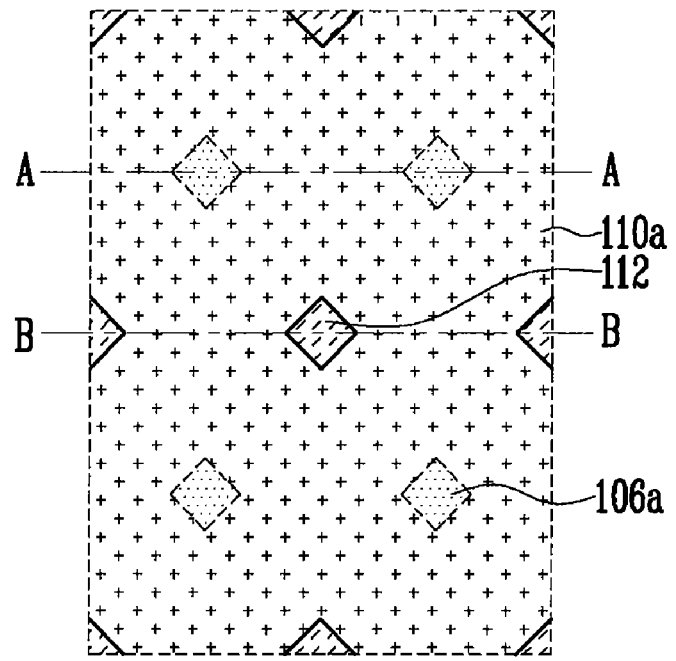
Figure 2E:
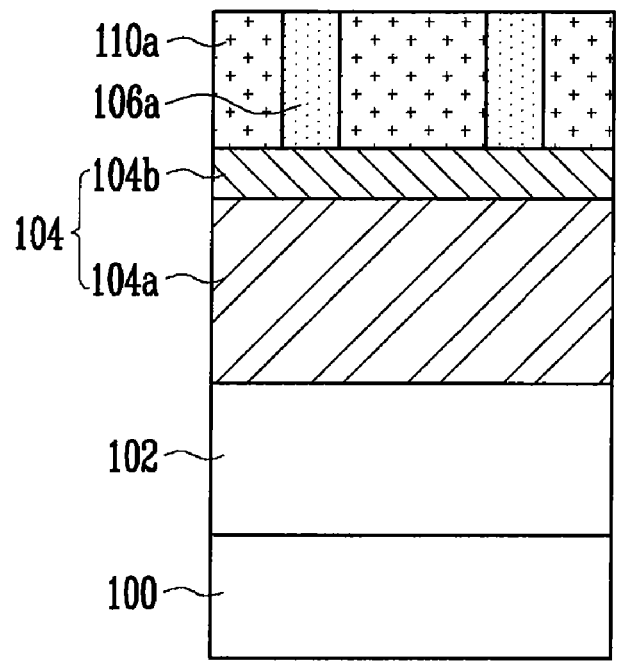
Figure 3E:
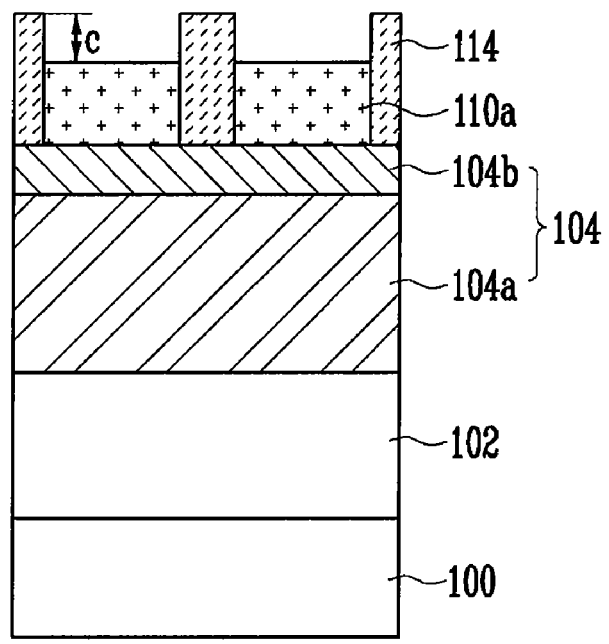

Referring to FIGS. 1E, 2E and 3E, the second hard mask layer 114 is etched using an etch process until a top surface of the first auxiliary pattern 110 is exposed. The first auxiliary pattern 110 is exposed using an etch process until a top surface of the insulating patterns 106a is exposed, thus forming a second auxiliary pattern 110a. The etch process may be performed using an etchback process. At the time of the formation process of the second auxiliary pattern 110a, a top surface of the second auxiliary pattern 110a formed in the peripheral region of the first contact holes 112 is partially removed, so the second auxiliary pattern 110a has a step c with the remaining second hard mask layer 114.

Figure 1F:
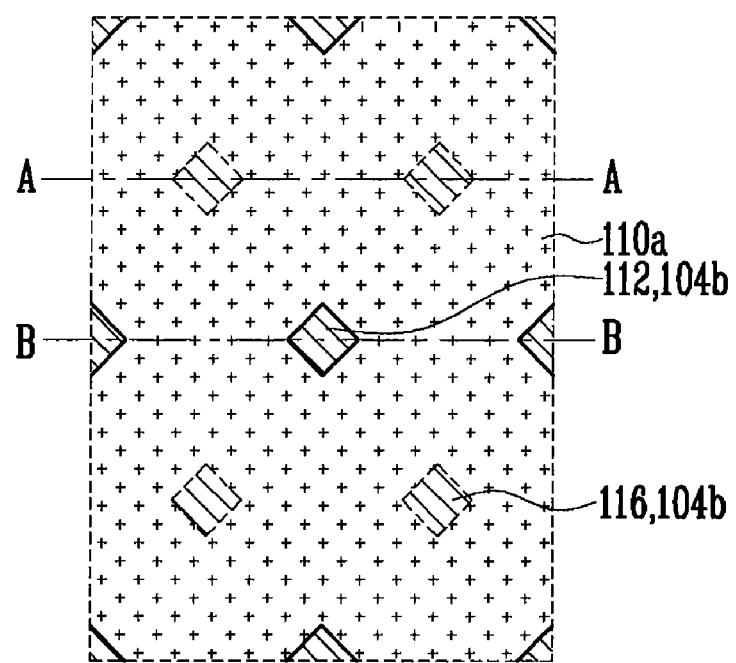
Figure 2F:
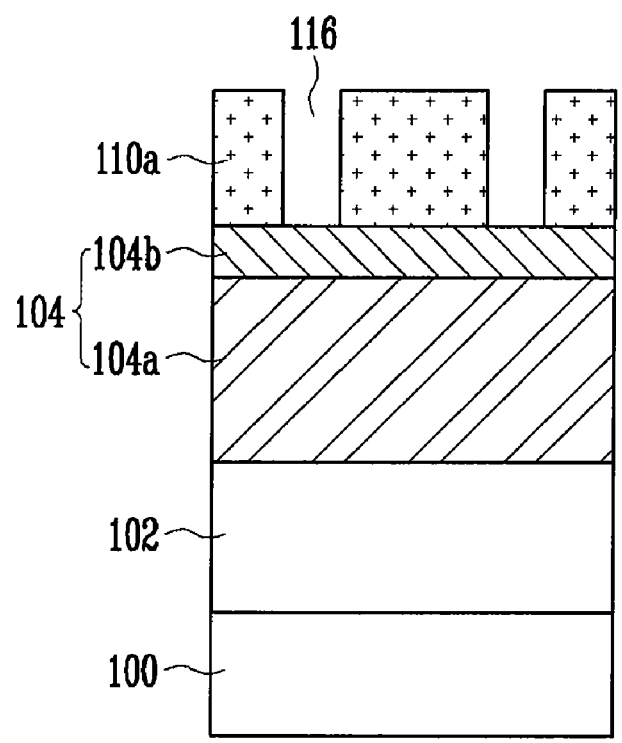
Figure 3F:
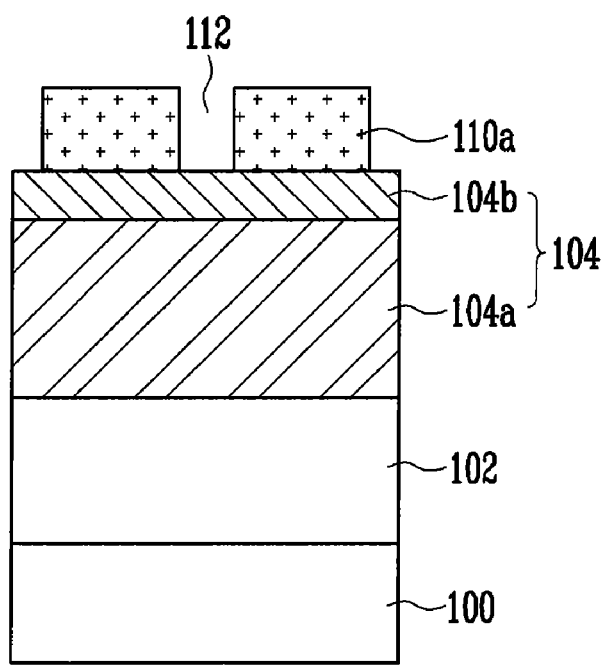

Referring to FIGS. 1F, 2F and 3F, second contact holes 116 are formed between the second auxiliary patterns 110a by removing the insulating patterns 106a exposed in the formation process of the second auxiliary pattern 110a and the remaining second hard mask layer 114. The second contact holes 116 are regions in which bit line contact holes are formed in a subsequent process. At the time of the removal process of the insulating patterns 106a the remaining second hard mask layer 114, the insulating patterns 106a and the second hard mask layer 114 have an etch selectivity different from that of the second auxiliary pattern 110a, so that the second auxiliary pattern 110a can be removed without being damaged.

Figure 1G:
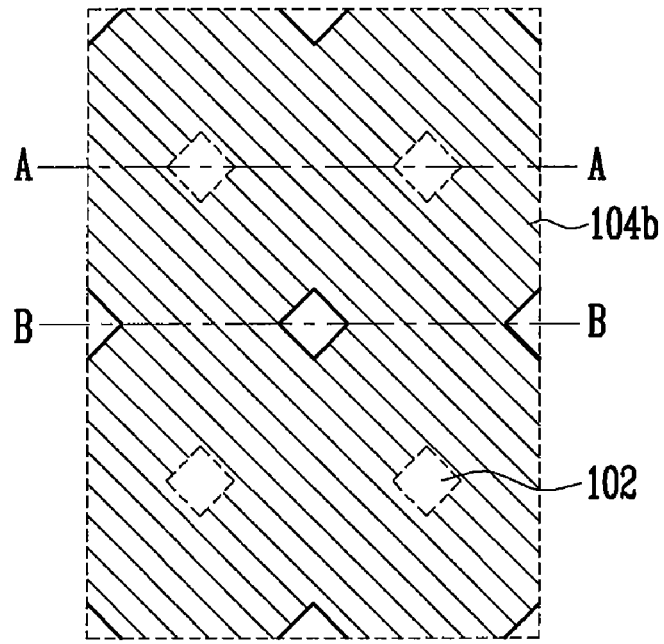
Figure 2G:
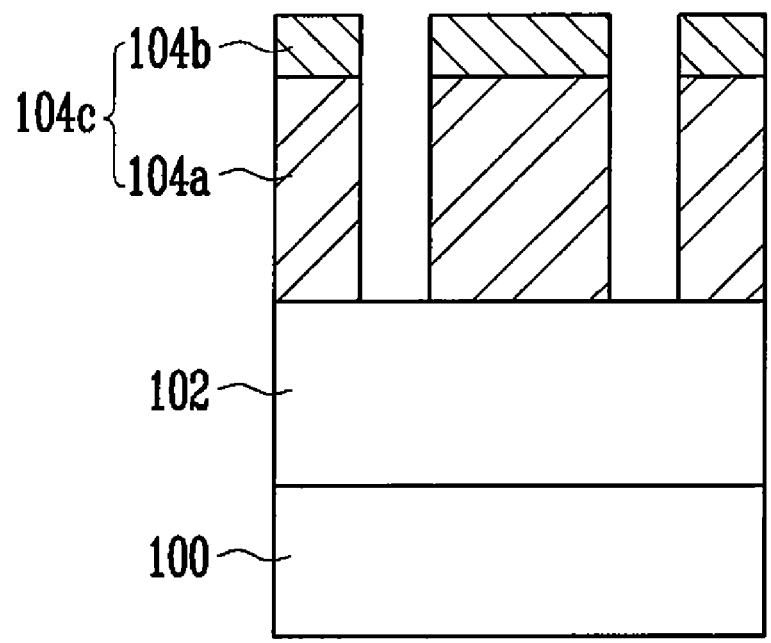
Figure 3G:
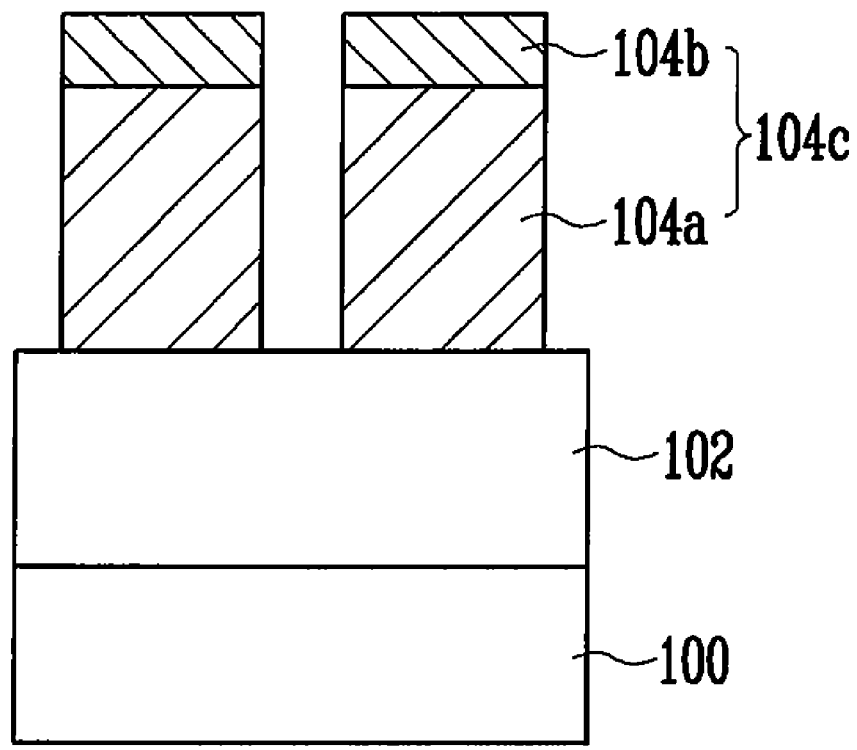

Referring to FIGS. 1G, 2G and 3G, a first hard mask pattern 104c having a desired line and space is formed by etching the first hard mask layer 104 using the second auxiliary pattern 110a as an etch mask. The first hard mask layer 104 may be removed using a dry etch process. The second auxiliary pattern 110a is then removed.

Figure 1H:
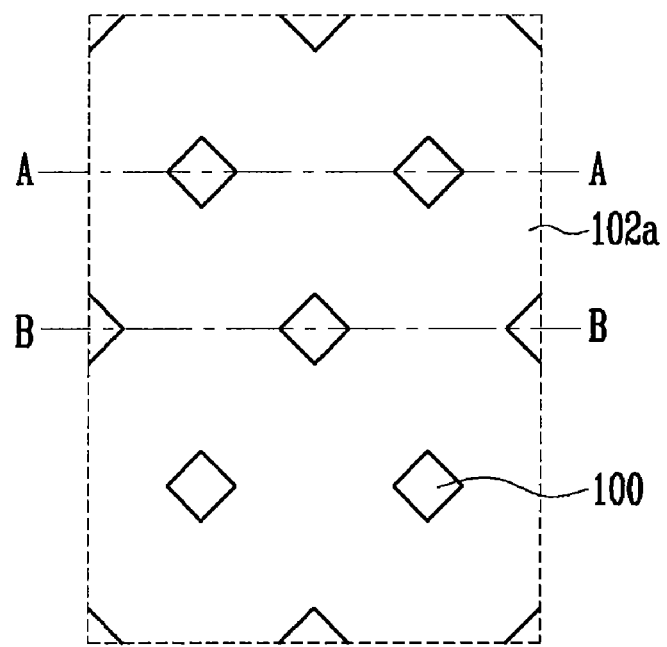
Figure 2H:
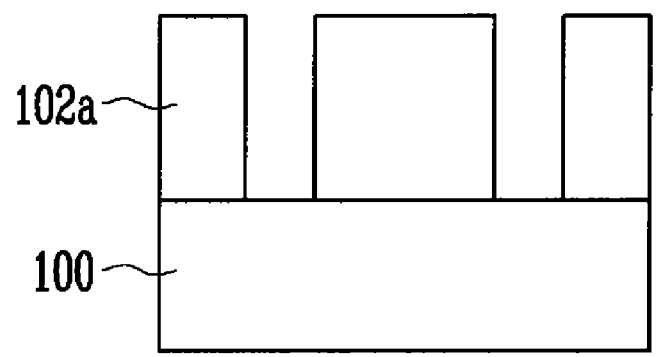
Figure 3H:
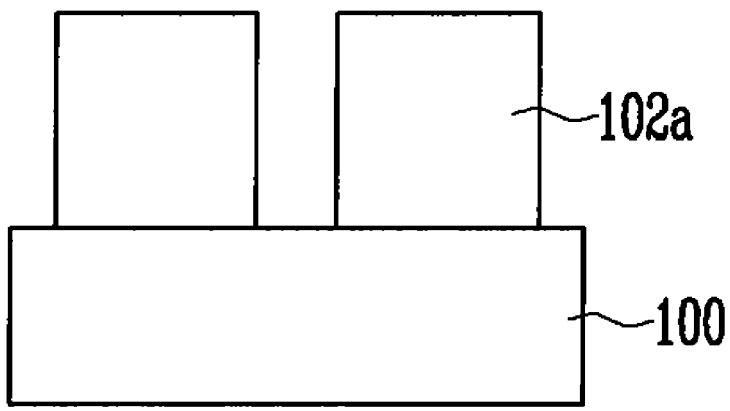

Referring to FIGS. 1H, 2H and 3H, a target pattern 102a is formed by etching the etch target layer 102 using the first hard mask pattern 104c, having a desired line and space, as an etch mask. The etch target layer 102 is made of a material deposited to form bit line contact holes. Thus, the bit line contact holes can be formed by forming the target pattern 102a using an etch process. The first hard mask pattern 104c is then removed.

As described above, the first auxiliary pattern having the first contact hole, which has the same shape as that of the insulating pattern, is formed at the center of the four adjacent insulating patterns, which form a quadrilateral. Thus, a micro pattern having a target CD can be formed and the present invention can also be applied to a DRAM bit line contact hole formation process.

Further, a micro pattern with a resolution higher than the resolution of the existing exposure equipment can be formed and applied to a formation process of DRAM bit line contact holes. Accordingly, the resolution limits of the exposure equipment can be overcome.

Moreover, micro patterns can be formed using existing exposure equipment without the need to develop new exposure equipment with increased resolution capability.

In addition, the process steps can be reduced by omitting the formation process of the second hard mask layer.

Incidentally, since the process steps are reduced, the production cost can be reduced.

The present invention is not limited to the disclosed embodiments, but may be implemented in various manners. The embodiments are provided to complete the disclosure of the present invention and to allow those having ordinary skill in the art to understand the scope of the present invention. The present invention is defined by the category of the claims.

What is claimed is:

1. A method of forming a micro pattern of a semiconductor device, the method comprising:
   forming an etch target layer and a first hard mask layer over a semiconductor substrate;
   forming a plurality of insulating patterns having a lozenge shape over the first hard mask layer in a longitudinal direction and a cross direction;
   forming a first auxiliary pattern on the first hard mask layer including the insulating patterns, wherein the first auxiliary pattern is formed on sidewalls of the insulating patterns to a thickness to the extent that gap regions between adjacent insulating patterns in at least one of the longitudinal direction or the cross direction are buried, and a contact hole having substantially the same shape as that of the insulating pattern is formed at the middle of four adjacent insulating patterns, which form a quadrilateral;
   forming a second auxiliary pattern by etching the first auxiliary pattern so that a top surface of the insulating patterns is exposed;
   removing the exposed insulating patterns;
   forming a first hard mask pattern by etching the first hard mask layer using an etch process employing the second auxiliary pattern as an etch mask; and
   etching the etch target layer using the first hard mask pattern.

2. The method of claim 1, wherein the etch target layer has a stack structure including a conductive layer and an insulating layer.

3. The method of claim 1, wherein the first hard mask layer has a stack structure including an amorphous carbon layer and a SiON layer.

4. The method of claim 1, wherein the insulating patterns are made of oxide.

5. The method of claim 1, wherein the first auxiliary pattern is formed from a carbon layer or a polysilicon layer.

6. The method of claim 1, wherein the first auxiliary pattern has an etch selectivity different from that of the insulating patterns.

7. The method of claim 1, wherein the first auxiliary pattern is foamed to a thickness so that the first auxiliary pattern formed on a sidewall of an end of the insulating pattern touches with the first auxiliary pattern formed on a sidewall of an end of an adjacent insulating pattern.

8. The method of claim 1, wherein the first auxiliary pattern formed in the peripheral region of the contact hole has a step with the first auxiliary pattern formed on the insulating patterns.

9. The method of claim 1, wherein the first auxiliary pattern formed in the peripheral region of the contact hole is lower in height than the first auxiliary pattern formed on the insulating patterns.

10. The method of claim 1, further comprising forming a second hard mask layer on the first auxiliary pattern so that a space between the contact holes is gap filled after the first auxiliary pattern is formed.

11. The method of claim 10, wherein the second hard mask layer is made of a conductive material or an insulating material.

12. The method of claim 10, wherein the second hard mask layer is made of an Organic Bottom Anti-Reflective Coating (OBARC) material containing silicon (Si), or a Spin on Glass (SOG) material.

13. The method of claim 12, further comprising performing a bake process after a deposition process when the SOG material is used.

14. The method of claim 10, wherein the second hard mask layer has an etch selectivity different from that of the first auxiliary pattern.

15. The method of claim 10, further comprising removing the second hard mask layer until a top surface of the first auxiliary pattern is exposed after the second hard mask layer is formed.

16. The method of claim 1, wherein the first auxiliary pattern is etched using an etchback process.

17. The method of claim 1, wherein at the time of the etch process of the first auxiliary pattern formed on the insulating patterns, a top surface of the first auxiliary pattern formed in the peripheral region of the contact hole is partially removed.

18. The method of claim 10, wherein at the time of the removal process of the insulating patterns, the remaining second hard mask layer is removed.

19. The method of claim 1, wherein the second auxiliary pattern formed in the peripheral region of the contact hole has a step with the second auxiliary pattern formed in the peripheral region of the insulating patterns.

20. The method of claim 1, wherein the second auxiliary pattern formed in the peripheral region of the contact hole is lower in height than the second auxiliary pattern formed in the peripheral region of the insulating patterns.

21. A method of forming a micro pattern of a semiconductor device, the method comprising:
    forming an etch target layer a first hard mask layer, over a semiconductor substrate;
    forming a plurality of insulating having a lozenge shape over the first hard mask layer in a longitudinal direction and a cross direction;
    forming a first auxiliary pattern on the first hard mask layer including the insulating patterns, wherein the first auxiliary pattern is formed on sidewalls of the insulating patterns to a thickness to the extent that gap regions between adjacent insulating patterns in at least one of the longitudinal direction or the cross direction are buried, and a contact hole having the same shape as that of the insulating pattern is foinied in the middle of four adjacent insulating patterns that define a quadrilateral;
    forming a second hard mask layer between the first auxiliary patterns;
    forming a second auxiliary pattern by etching the first auxiliary pattern so that a top surface of the insulating patterns is exposed;
    removing the exposed insulating patterns and the second hard mask;
    forming a first hard mask pattern by etching the first hard mask layer using an etch process employing the second auxiliary pattern as an etch mask; and
    etching the etch target layer using the first hard mask pattern.

22. The method of claim 21, wherein the etch target layer has a stack structure including a conductive layer and an insulating layer.

23. The method of claim 21, wherein the first hard mask layer has a stack structure including an amorphous carbon layer and a SiON layer.

24. The method of claim 21, wherein the insulating patterns are made of oxide.

25. The method of claim 21, wherein the first auxiliary pattern is formed from a carbon layer or a polysilicon layer.

26. The method of claim 21, wherein the first auxiliary pattern has an etch selectivity different from that of the insulating patterns.

27. The method of claim 21, wherein the first auxiliary pattern is formed to a thickness so that the first auxiliary pattern formed on a sidewall of an end of the insulating pattern touches with the first auxiliary pattern formed on a sidewall of an end of an adjacent insulating pattern.

28. The method of claim 21, wherein the first auxiliary pattern formed in the peripheral region of the contact hole has a step with the first auxiliary pattern formed on the insulating patterns.

29. The method of claim 21, wherein the first auxiliary pattern formed in the peripheral region of the contact hole is lower in height than the first auxiliary pattern formed on the insulating patterns.

30. The method of claim 21, wherein the second hard mask layer is made of a conductive material or an insulating material.

31. The method of claim 21, wherein the second hard mask layer is made of an OBARC material containing silicon (Si), or a SOG material.

32. The method of claim 31, further comprising performing a bake process after a deposition process when the SOG material is used.

33. The method of claim 21, wherein the second hard mask layer has an etch selectivity different from that of the first auxiliary pattern.

34. The method of claim 21, wherein the first auxiliary pattern is etched using an etchback process.

35. The method of claim 21, wherein at the time of the etch process of the first auxiliary pattern formed on the insulating patterns, a top surface of the first auxiliary pattern formed in the peripheral region of the contact hole is partially removed.

36. The method of claim 21, wherein the second auxiliary pattern formed in the peripheral region of the contact hole has a step with the second auxiliary pattern formed in the peripheral region of the insulating patterns.

37. The method of claim 21, wherein the second auxiliary pattern formed in the peripheral region of the contact hole is lower in height than the second auxiliary pattern formed in the peripheral region of the insulating patterns.

* * * * *